United States Patent [19]

Ishiko et al.

[11] Patent Number: 4,999,571
[45] Date of Patent: Mar. 12, 1991

[54] CURRENT AND/OR VOLTAGE DETECTOR FOR A DISTRIBUTION SYSTEM

[75] Inventors: Daisuke Ishiko; Kazurou Toda, both of Hirakata; Osamu Kamada, Ikoma; Akihiro Miura, Akashi, all of Japan

[73] Assignees: Matsushita Electric Industrial Co., Ltd.; Kansai Electric Power Co., Inc., both of Osaka, Japan

[21] Appl. No.: 340,934

[22] Filed: Apr. 20, 1989

[30] Foreign Application Priority Data

Apr. 22, 1988 [JP] Japan ................................ 63-100766
Apr. 22, 1988 [JP] Japan ................................ 63-100767

[51] Int. Cl.[5] .......................... G01R 1/02; G01R 19/00
[52] U.S. Cl. ................................ 324/96; 324/117 R; 324/127
[58] Field of Search ............... 324/96, 117 R, 1266, 324/127, 142

[56] References Cited

U.S. PATENT DOCUMENTS

| | | | |
|---|---|---|---|
| 3,386,032 | 5/1968 | Medlar | 324/127 |
| 3,538,440 | 11/1970 | Galloway | 324/126 |
| 4,240,031 | 12/1980 | Siegenthaler | 324/126 |
| 4,295,094 | 10/1981 | Wilreker et al. | 324/96 |
| 4,510,441 | 4/1985 | Yasuda et al. | 324/96 |
| 4,719,415 | 1/1988 | Mehnert | 324/96 |
| 4,791,361 | 12/1988 | Beihoff et al. | 324/117 R |
| 4,797,607 | 1/1989 | Dupray | 324/96 |
| 4,847,780 | 7/1989 | Gilker et al. | 324/127 |

FOREIGN PATENT DOCUMENTS

| | | | |
|---|---|---|---|
| 0256207 | 2/1988 | European Pat. Off. | |
| 4634263 | 12/1971 | Japan | 324/96 |
| 0132178 | 6/1987 | Japan | 324/96 |
| 0098567 | 4/1988 | Japan | 324/96 |
| 78120801 | 10/1989 | Japan | |

OTHER PUBLICATIONS

"The Principle and the Application of Sensor", pp. 314–317, Section 6-2-2, published by Chuan-Hwa Co., Feb. 1984.
"The Property and Application of Optical Fiber", pp. 184–189, Section 8-4-5, published by Chuan-Hwa Co.

Primary Examiner—Kenneth Wieder
Assistant Examiner—William J. Burns
Attorney, Agent, or Firm—Panitch Schwarze Jacobs & Nadel

[57] ABSTRACT

A current and voltage detector for a distribution system is provided with a lower section, an upper section and a fastener for combining the lower and upper sections into one body. The lower section comprises: a first groove for receiving an electric wire of the distribution system; an optical type current sensor; an optical type voltage sensor; and a potential divider for supplying a voltage to the voltage sensor. The upper section comprises: a second groove for receiving the electric wire; and a U-shaped magnetic core for applying a magnetic field to the current sensor.

14 Claims, 7 Drawing Sheets

CURRENT AND/OR VOLTAGE DETECTOR FOR A DISTRIBUTION SYSTEM

BACKGROUND OF THE INVENTION

1. Field of the Invention

This invention relates to a current and/or voltage detector for a distribution system, and, more particularly to a current and/or voltage detector for an aerial distribution line.

2. Description of the Prior Art

In the modern world where even an instantaneous power failure is not allowed, it is required to always monitor the conditions of power transmission and distribution lines. It is well known in the art that the detection of various currents such as a zero-sequence current flowing through a transmission or distribution line is very useful in monitoring the condition of the line. Also, voltages of various parts of the line are beneficial in the monitoring. In order to detect such a current and/or voltage, a distribution line is provided with many detectors. An example of such detectors is a zero-sequence current transformer (hereinafter, referred to as "ZCT") which is installed in a aerial distribution line.

A ZCT used in a three-phase transmission line comprises a ring type core through which all the three wires pass. When a ZCT is installed in an aerial three-phase distribution line, the ZCT is generally disposed in a pole line switch having a relay so that an unbalance in the currents or voltages of each phases can be detected. A conventional line switch is shown in FIG. 7, wherein a three-phase line 71a is connected through a line switch 72 and tension insulators 73 mounted on a pole 74 to another three-phase line 71b. A ZCT and relay (which are not shown) are incorporated in the line switch 72. If a fault occurs in the line 71a or 71b, the ZCT detects the zero-sequence current to actuate the relay, thereby actuating the switch 72 to interrupt the connection between the lines 71a and 71b.

In this configuration of the ZCT, however, the three wires to which the phase voltage is applied are gathered in the window of the ZCT, resulting in that it is very difficult to insulate the wires from each other. Further, the insulation between the three wires deteriorates in the course of service or depending upon the degree of air tightness of the line switch 72, causing an inferior reliability of the ZCT or a serious fault such as a short-circuit between the lines. This may be supported by the fact that a relatively large number of accidents have been caused in the vicinity of a ZCT. In order to prevent a fault of this kind from arising, it is required to periodically replace the wires in a line switch with new ones.

SUMMARY OF THE INVENTION

The current detector of this invention, which overcomes the above-discussed and numerous other disadvantages and deficiencies of the prior art, comprises a lower section, an upper section, and a fastening means for combining said lower and upper sections into one body, said lower section comprising:

a first receiving portion for receiving an electric wire of the distribution system, said first receiving portion being disposed on the upper surface of said lower section; and an optical type current sensor, said upper section comprising a second receiving portion for receiving the electric wire, said second receiving portion being disposed on the lower surface of said upper section to face said first receiving portion.

The voltage detector of this invention, which overcomes the above-discussed and numerous other disadvantages and deficiencies of the prior art, comprises: a lower section, an upper section, and a fastening means for combining said lower and upper sections into one body, said lower section comprising: a first receiving portion for receiving an electric wire of the distribution system, said first receiving portion being disposed on the upper surface of said lower section; and an optical type voltage sensor, said upper section comprising a second receiving portion for receiving the electric wire, said second receiving portion being disposed on the lower surface of said upper section to face said first receiving portion.

The current and voltage detector of this invention, which overcomes the above-discussed and numerous other disadvantages and deficiencies of the prior art, comprises a lower section, an upper section and a fastening means for combining said lower and upper sections into one body, said lower section comprising: a first receiving portion for receiving an electric wire of the distribution system, said first receiving portion being disposed on the upper surface of said lower section; an optical type current sensor; and an optical type voltage sensor, said upper section comprising a second receiving portion for receiving the electric wire, said second receiving portion being disposed on the lower surface of said upper section to face said first receiving portion.

In an embodiment of the detector according to the invention, said upper section further comprises a U-shaped magnetic core which surrounds said second receiving portion, the two end portions of said magnetic core protruding from the surface of said upper section, said lower section further comprises two recesses for receiving the two protruding end portions of said U-shaped core when said first and second sections are combined into one body, and said current sensor is disposed at the position which is located within the gap of said U-shaped magnetic core when said first and second sections are combined into one body.

In another embodiment of the invention, the position of said current sensor is adjustable.

In a further embodiment, said current sensor has a magnetic optical sensor element which detects, using the Faraday effect, the strength of a magnetic field generated by the current flowing through the electric wire received in said first and second receiving portions.

In a further embodiment, said lower section further comprises a capacitive type potential divider disposed in the vicinity of said first receiving portion, the output voltage of said potential divider being applied to said voltage sensor.

In a further embodiment, said upper section further comprises a further capacitive type potential divider disposed in the vicinity of said second receiving portion, said further potential divider and said potential divider of said lower section being electrically connected through a connecting means.

In a further embodiment, said voltage sensor has a sensor element which utilizes the Pockels effect.

In a further embodiment, at least either of the electrode area and electrode distance of said potential divider is adjustable.

Thus, the invention described herein makes possible the objectives of:

(1) to provide a current and/or voltage detector which can be easily attached to a distribution line;

(2) to provide a current and/or voltage detector which can operate stably for a long period of time without causing errors;

(3) to provide a current and/or voltage detector which can be installed at any position on a distribution system;

(4) to provide a current and/or voltage detector which which can be securely attached to a distribution line;

(5) to provide a current and/or voltage detector which can produce optical signals, thereby enabling a monitoring system to be controlled through optical fibers; and (6) to provide a current and/or voltage detector having a sensor, the property of which can be easily adjusted.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
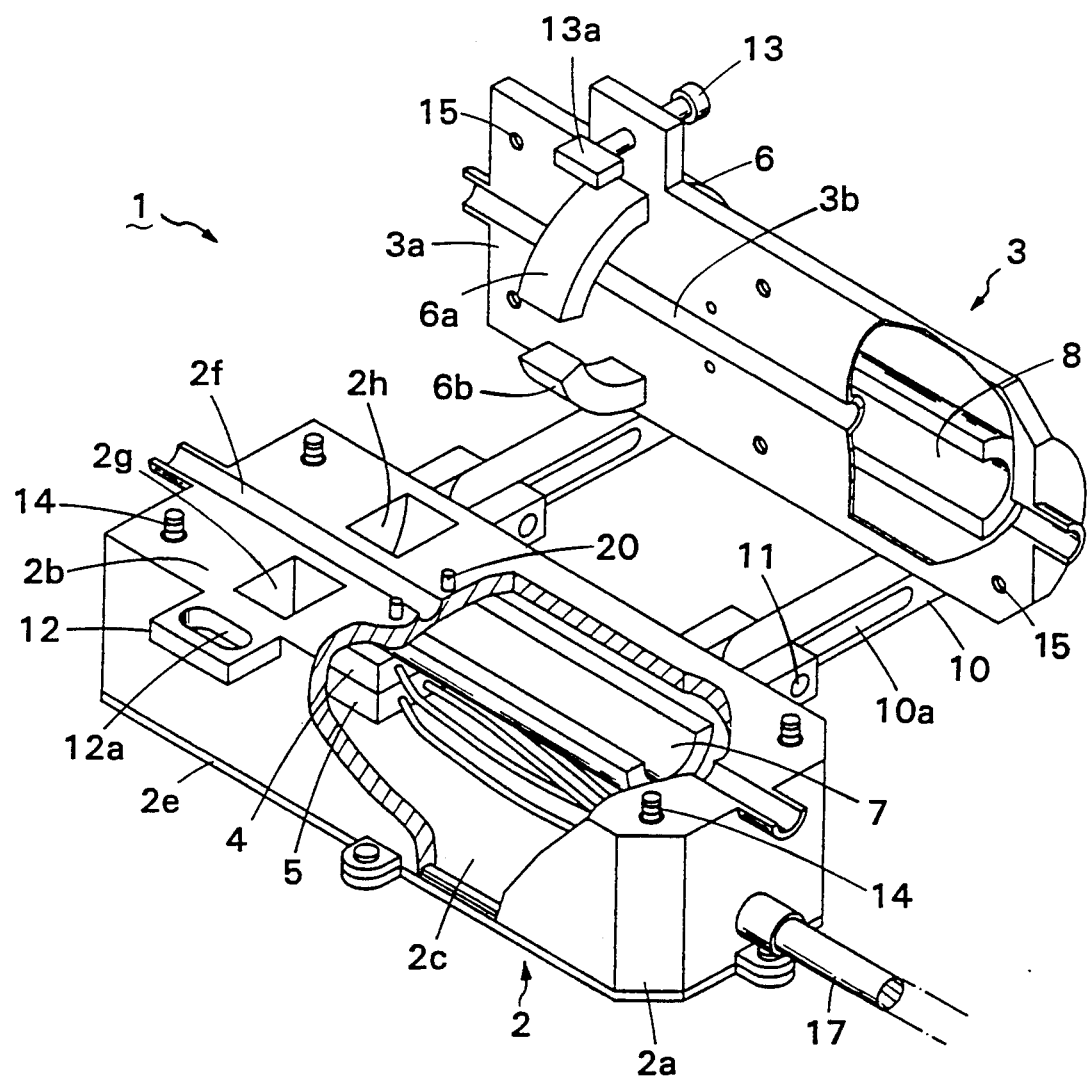
FIG. 1 is a partly fragmentary perspective view of the current and voltage detector according to the invention.

FIG. 1 illustrates an example of the detector according to the invention. The detector 1 of FIG. 1 is a current and voltage detector which is useful in a monitoring system for an aerial distribution line, and comprises a lower section 2 and an upper section 3. The lower section 2 incorporates an optical current sensor 4 and an optical voltage sensor 5.

Figure 2:
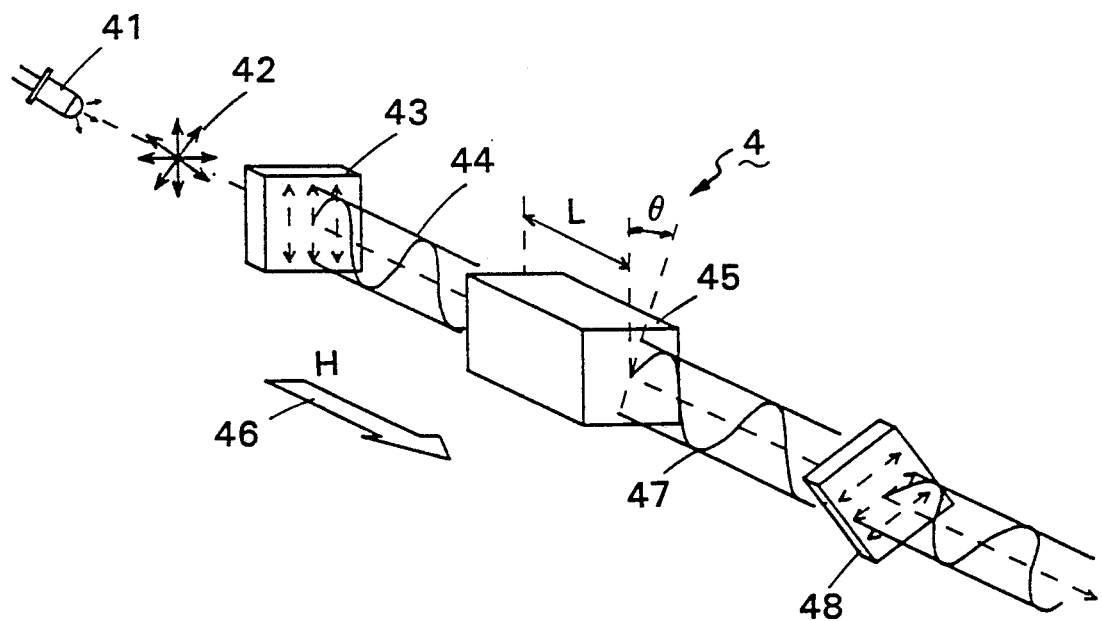
FIG. 2 is a diagram illustrating the principle of detecting a current by the detector of FIG. 1.

First, the principles of detecting a current and voltage by the sensors 4 and 5 will be described. The optical current sensor 4 comprises a magnetooptical element which detects the strength of a magnetic field caused by a current flowing through a wire, using the Faraday effect. With reference to FIG. 2, this will be described in more detail. Random light 42 from a light source 41 such as an LED is passed through a polarizer 43 to be changed into linearly polarized light 44. The linear polarized light 44 then impinges on a magnetooptical crystal such as a garnet (the length of which is L). In this example, a garnet containing bismuth is used as a magnetooptical crystal. When a magnetic field 46 of the strength H is applied in the same direction as the propagation direction of light 44, the plane of polarization of emitting light 47 is rotated by an angle $\theta$. The degree of the angle $\theta$ is detected as the light intensity by a light detector or analyzer 48. When the transmission polarization direction of the polarizer 43 is deviated by 45 degrees from that of the analyzer 48, the optical output P of the analyzer 48 is proportional to $\sin 2\theta$. Also, the relation $\theta = VLH$ (wherein V is the Verdet's constant) is well known. When $\theta < < 1$, $\sin 2\theta$ is approximately equal to $2\theta$, resulting in that the optical output P is proportional to the magnetic field strength H. In this way, the amount of a current flowing through a wire can be detected by optically measuring the magnetic field produced by the current around the wire.

Figure 3:
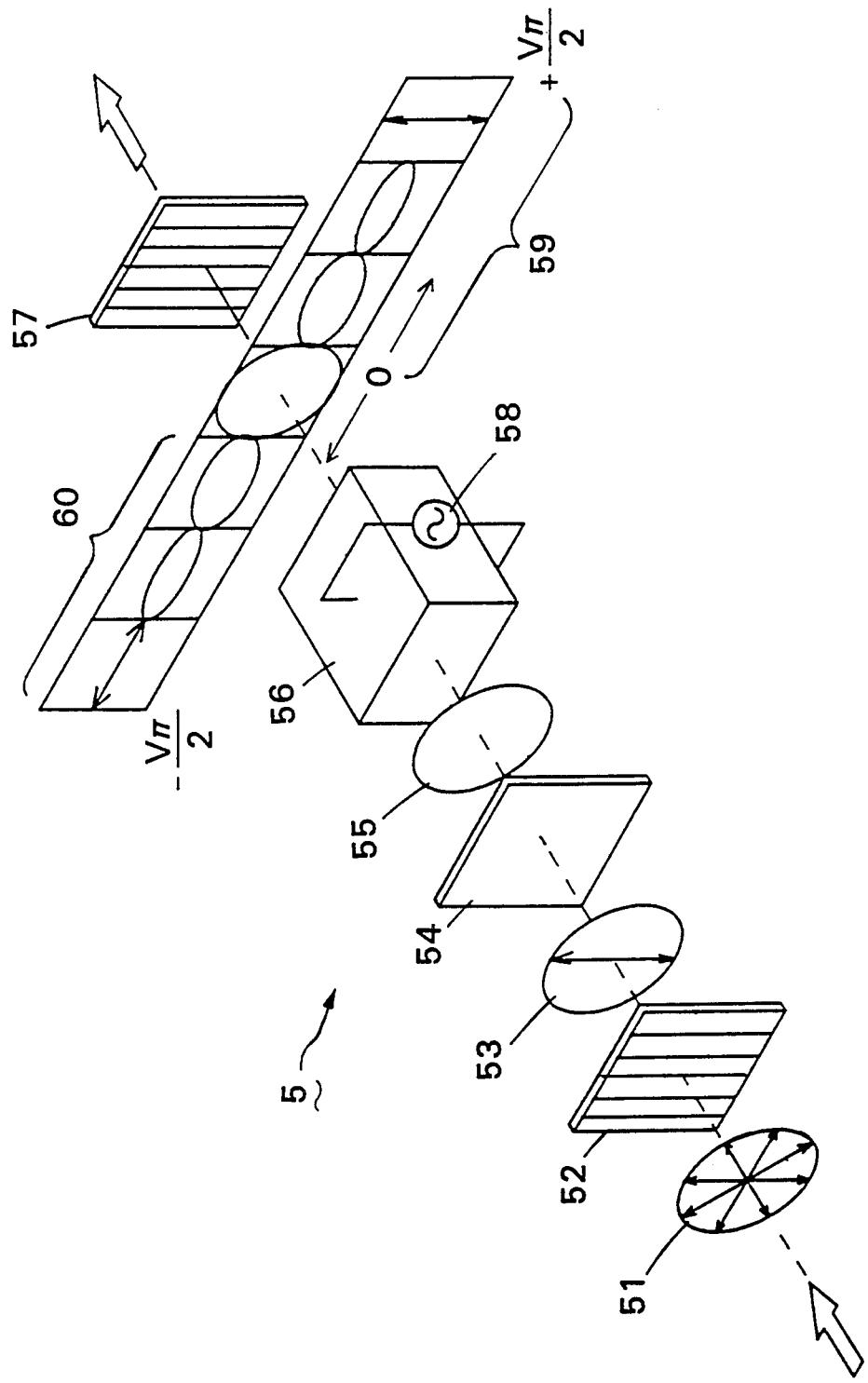
FIG. 3 is a diagram illustrating the principle of detecting a voltage by the detector of FIG. 1.

The optical voltage sensor 5 comprises a Pockels element. When light passes through the Pockels element, the quantity of the double refraction of the element changes in accordance with the strength of an electric field applied to the element. With reference to FIG. 3, this optical voltage detection will be described in more detail. Random light 51 from an appropriate light source (not shown) is passed through a polarizer 52 to be changed into linear polarized light 53. The linear polarized light 53 is then passed through a ¼ wavelength plate 54 to obtain circular polarized light 55 which is impinged onto a light detector or analyzer 57 after passing through a Pockels element 56. The Pockels element 56 is applied with a voltage 58 (e.g., the line to ground voltage of a distribution line). The form of the circular polarized light 55 changes depending upon the direction and strength of the applied voltage 58. Namely, as shown in FIG. 3, the circular polarized light 55 may become long elliptic polarized light 59 or wide elliptic polarized light 60 in accordance with the level of the applied voltage 58. This causes the change in the strength of light received by the analyzer 57. Hence, the voltage sensor 5 can optically detect the level of the voltage applied thereto.

In the detector of FIG. 1, a U-shaped core 6 and first and second potential dividers 7 and 8 of the capacitive type are provided for generating the magnetic field 46 and for obtaining the voltage 58, respectively. The first and second potential dividers 7 and 8 comprises a pair of electrodes 7a and 7b and 8a and 8b, respectively. These electrodes may be covered by a resin material such as urethane resin which can be set at room temperature. The kind of the resin material to be used is selected considering its dielectric constant.

Figure 4:
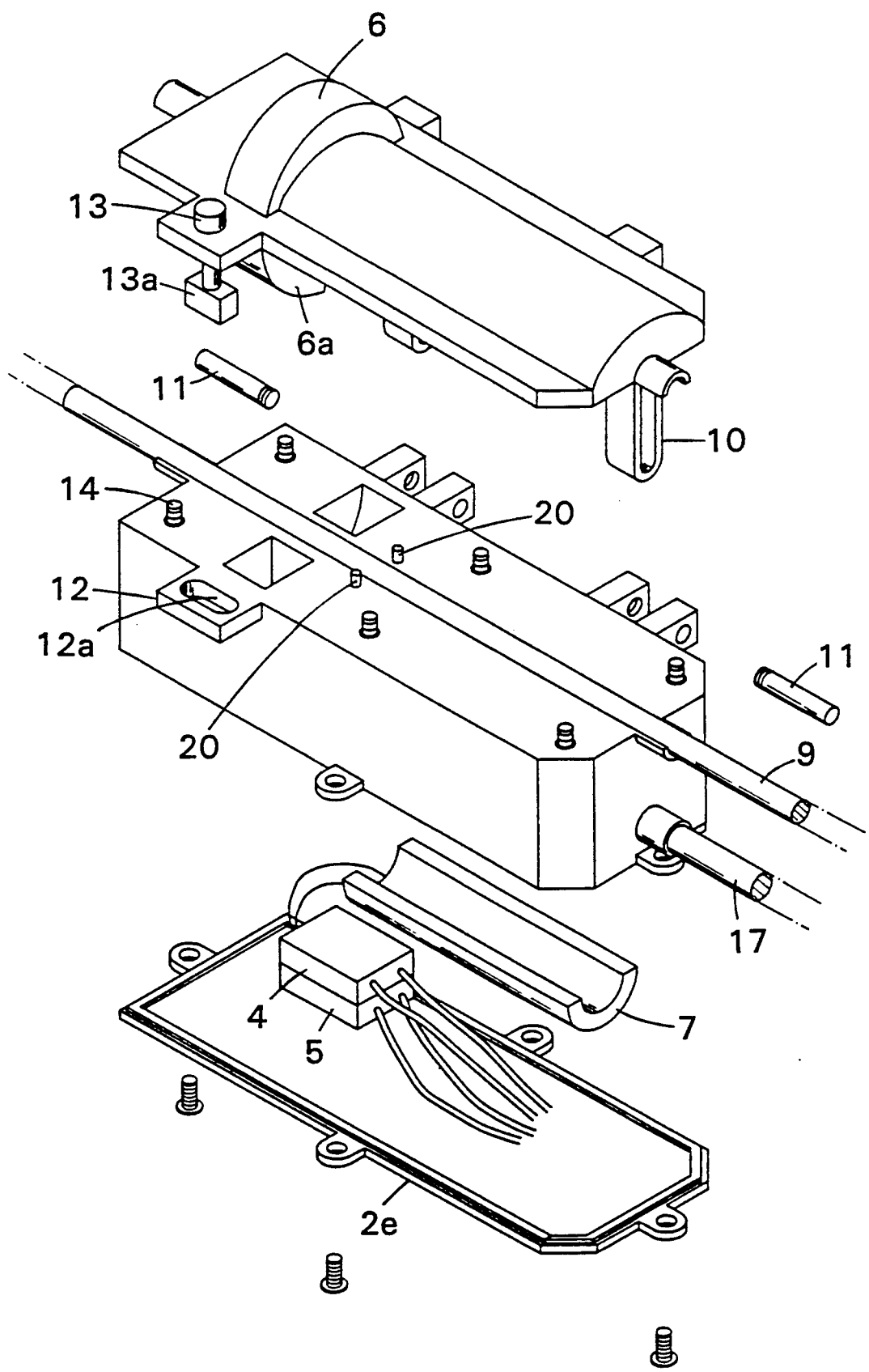
FIG. 4 is an exploded view of the detector of FIG. 1.
Figure 5:
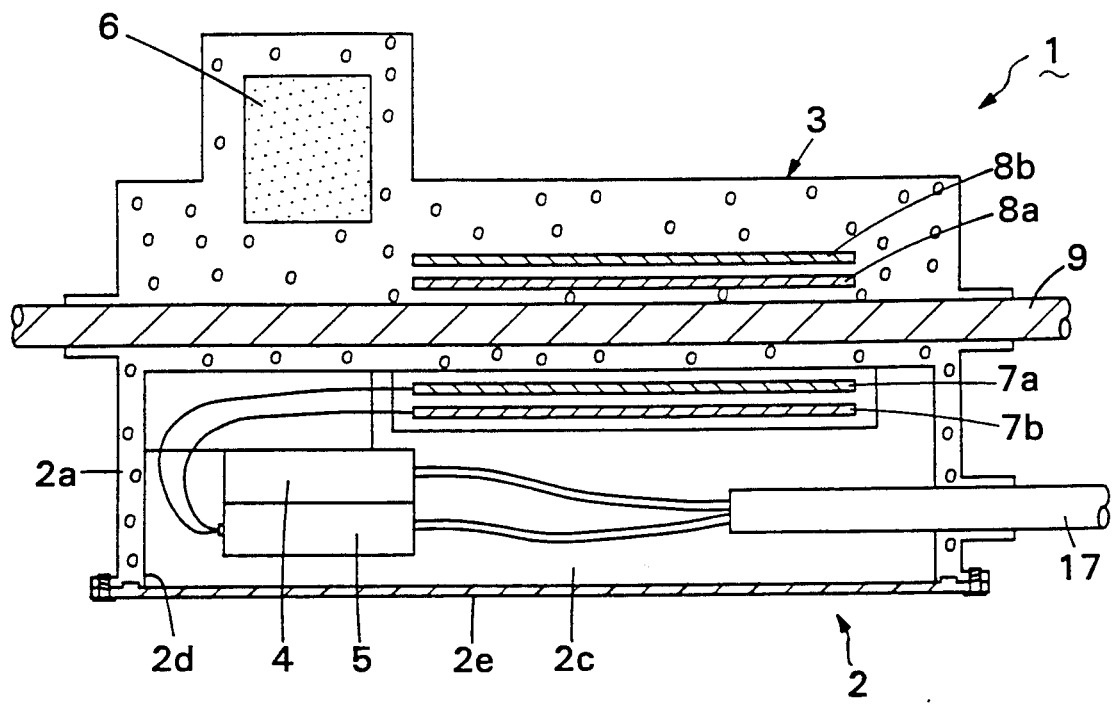
FIG. 5 is a sectional view illustrating the detector of FIG. 1 attached to a wire.

Referring to FIGS. 1, 4 and 5, the structure of the lower and upper sections 2 and 3 will be described in more detail. The lower section 2 has an elongated resin case 2a. The case 2a has a rectangular upper surface 2b, a hollow space 2c and an opening 2d. In the space 2c, the optical current sensor 4, the optical voltage sensor 5 and the first potential divider 7 are disposed. The case 2a is hermetically sealed by a cover 2e which is bolted to the opening 2d. On the upper surface 2b, a semicircular groove 2f elongates along the central axis of the surface 2b.

The upper section 3 is formed by the resin molding, and has a semicylindrical shape with a rectangular lower surface 3a. The shape of the lower surface 3a substantially corresponds to that of the upper surface 2b. Another semicircular groove 3b is formed in such a manner that the groove 3b cooperates with the groove 2f of the lower section 2 to form a cylindrical space for receiving a distribution wire 9. The second potential divider 8 is disposed along the groove 3b at one end region of the upper section 3. The U-shaped magnetic core 6 is formed at the other end region of the upper section and substantially encircles the groove 3b. The two ends 6a and 6b of the core 6 protrude from the lower face 3a. When the lower an upper sections 2 and 3 are combined to each other, the two ends 6a and 6b can be inserted into two recesses 2g and 2h formed on the upper surface 2b of the lower section 2, respectively, so that the optical current sensor 4 is positioned in the gap of the core 6.

From one side of the upper section 3, two arms 10 having a hole 10a are extended. The arms 10 are arranged along the direction of the groove 3b, and are slidably and rotatably attached to the lower section 2 by pins 11, so that the device 1 can be split into the lower and upper sections 2 and 3 while preventing the two sections 2 and 3 from being completely separated, as shown in FIG. 1. This allows the easy attachment of the present device to a distribution wire 9.

The lower section 2 is provided with a member 12 having a oval hole 12a. On the other hand, the upper section has a hook 13 having a rectangular head 13a. When the lower and upper sections 2 and 3 are to be combined into one body, the hook 13 is inserted into the hole 12a, and the head 13a is twisted to temporarily fasten the two sections 2 and 3 together. The lower section 2 is provided with six bolts 14 protruding from the upper surface 2b. On the lower surface 3a of the upper section 3, six threaded holes 15 are formed at the positions corresponding to those of the bolts 14.

The corresponding electrodes 7a and 8a and 7b and 8b of the first and potential dividers 7 and 8 are connected with each other via terminals 20 on the upper surface 2b, when the sections 2 and 3 are combined.

In this example, the current sensor 4 is fixed on the voltage sensor 5. The combination of the sensors 4 and 5 is mounted to the case 2a in an adjustable manner, enabling the adjustment of the relative positional relationship between the current sensor 4 and the gap of the core 6.

In order to compensate the scattering in the properties of optical current sensors or voltage sensors among detectors, the strength of the magnetic field 46 or the level of the applied voltage 58 can be adjusted. It is preferable that, when manufacturing the detector 1, the detector is attached to an electric wire through which a predetermined level of current is flowing, and the position of the combination of the sensors 4 and 5 is adjusted so as to obtain an output of the current sensor 4 accurately corresponding to the current level. After the positional adjustment, the combination of the sensors 4 and 5 is fixed to the case 2a by an adhesive agent so that the current sensor 4 does not move. Alternatively, the case 2a may have a recess in which the combination of the sensors can be easily fixed in a predetermined position. In order to finely adjust the position of the current sensor 4, thin polyethylene plates (e.g., about 0.2 mm) may be used. The level of the voltage applied to the voltage sensor 5, i.e., the output voltage of the potential divider 7 can be adjusted by changing the position and/or area of the electrode 7a, 7b, 8a or 8b. In order to facilitate this adjustment, the potential divider 7 may be installed in the case 2a without being resin-molded. After the optical sensor 4 is fixed and the properties of the potential divider 7 is adjusted as described later, a gum-like resin material such as urethane resin may be poured into the case 2a to enhance the seal of the lower section 2.

In this example, the potential dividers 7 and 8 are installed in the lower and upper sections 2 and 3, respectively, and the corresponding electrodes of the two dividers are electrically connected to each other, thereby allowing the reduction of the length of the dividers along the wire 9.

The signals output from current and voltage sensors 4 and 5 are transmitted to a control device 16 (FIG. 6) through an optical fiber cable 17.

The detector 1 can be attached to the wire 9 in the following manner. The lower section 2 is positioned so that the wire 9 is received in the groove 2f, and thereafter the upper section 3 is placed over the lower section 2 so that the wire 9 is received in the cylindrical space formed by the grooves 2f and 3b. The hook 13 is engaged with the member 12 to temporarily fasten the two sections 2 and 3 with each other. Then, the bolts 14 are rotated to engage with the threaded holes 15, thereby securely attaching the detector 1 to the wire 9 while firmly combining the lower and upper sections 2 and 3. This state is diagrammatically illustrated in FIG. 5.

Figure 6:
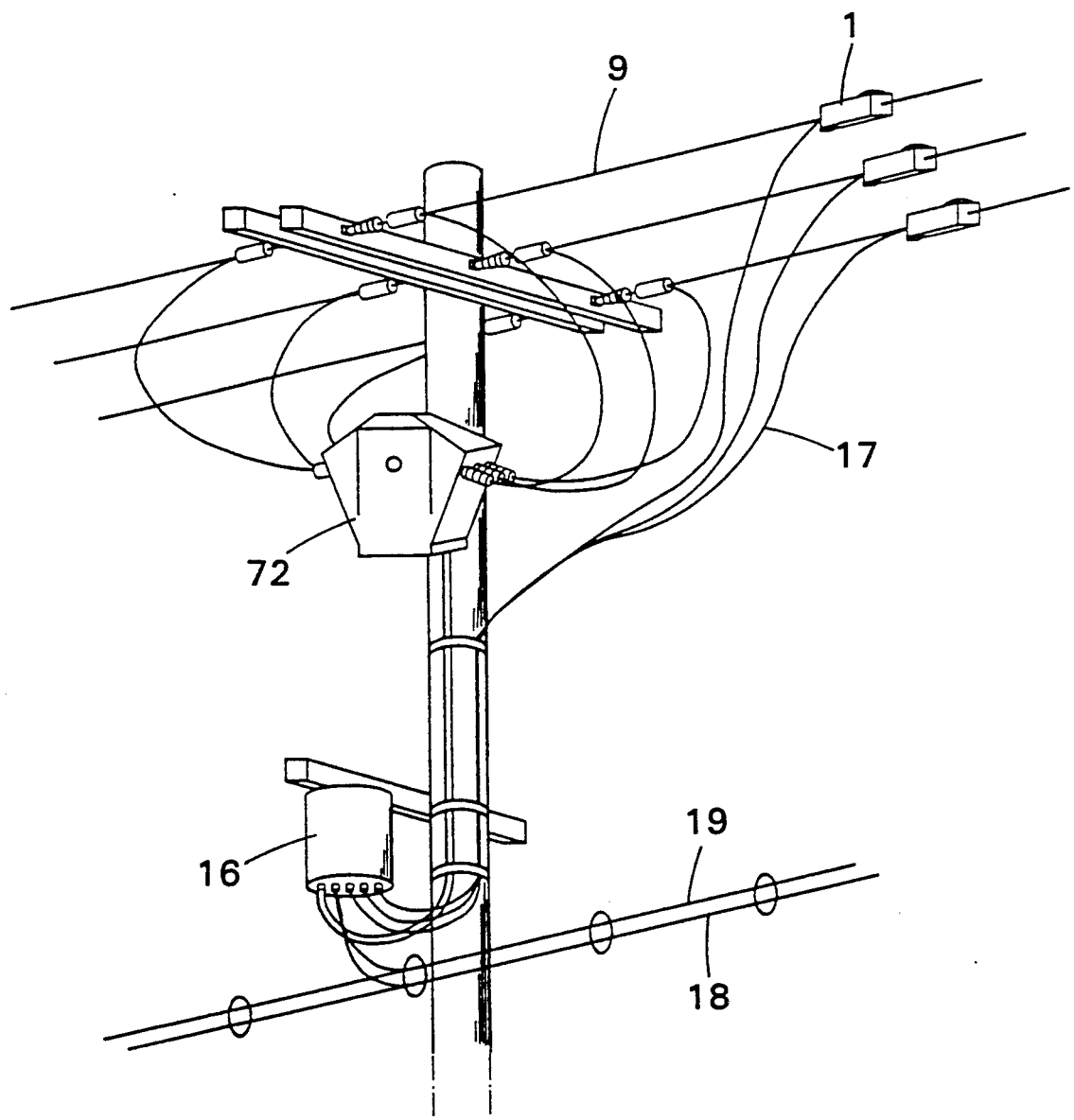
FIG. 6 is a perspective view showing the manner of attaching the detectors of FIG. 1 to a three-phase distribution line.
Figure 7:
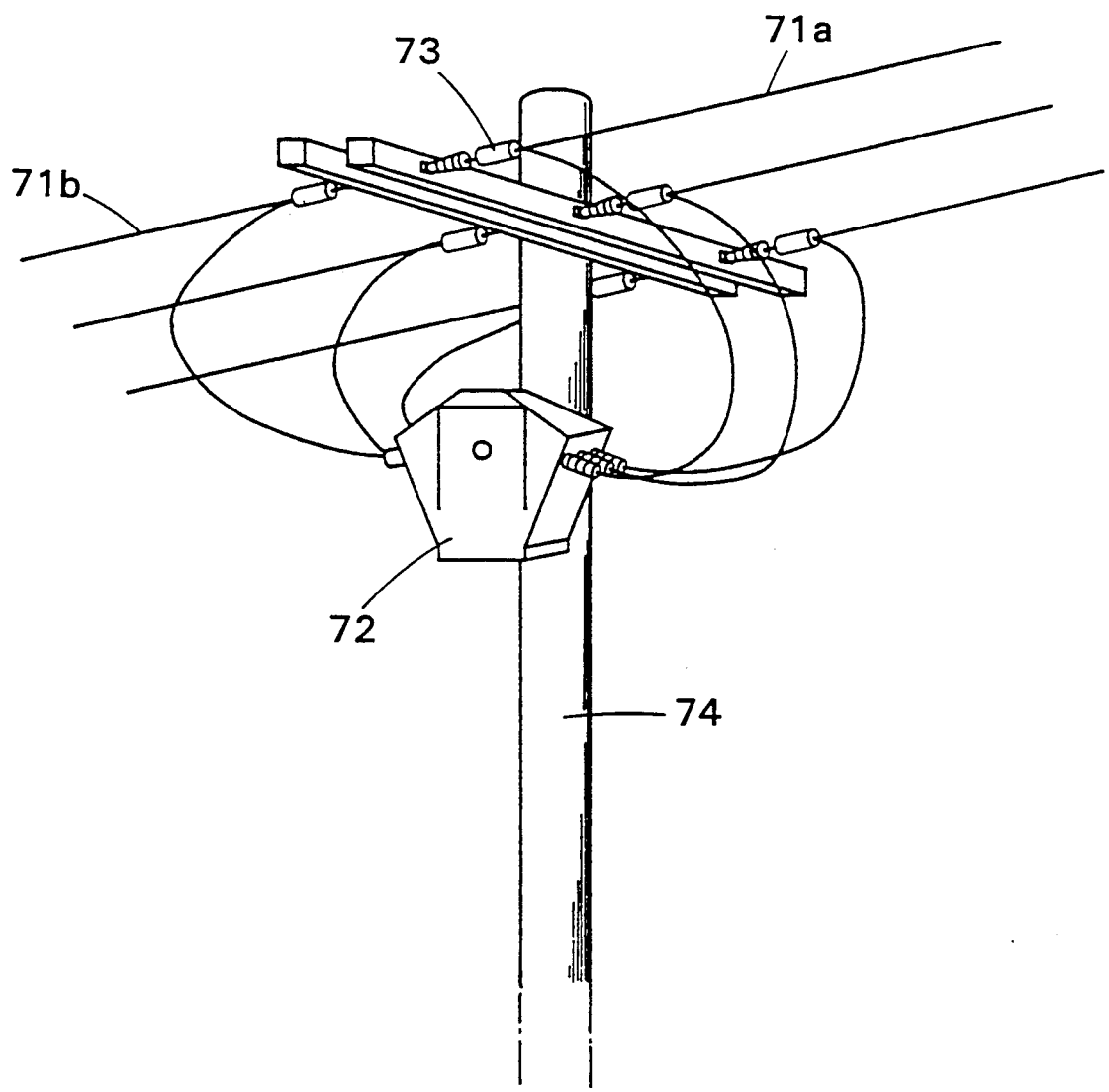
FIG. 7 is a perspective view showing a manner of installing a ZCT to a three-phase distribution line.

FIG. 6 illustrates an example of attaching the detector 1 to an aerial three-phase distribution line. In the example of FIG. 6, one detector 1 is attached to each of the wires 9 of the three-phase line. The detectors 1 can be positioned at either side of the line switch 72, so that the side of the line the condition of which is to be monitored can be freely selected. The optical signals of the detectors 1 are transmitted via the optical cables 17 to the control device 16 in which the signals are processed to obtain signals useful for monitoring the conditions of the distribution line (for example, a zero-sequence current). The output of the control device 16 is supplied to the line switch 72 to operate it, and also supplied to a substation through a communication line 18. The electric power for the detectors 1 and control device 16 is supplied through a power line 19 from the substation.

In the detector according to the invention, a highly reliable insulation can be easily achieved, output signals can be transmitted through an optical cable so that a remote fault detection or control of a transmission or distribution line can be realized, and the concentration of wires as required in the prior art can be eliminated. Hence, the detector of the invention can assure a high reliability for a long period of time. In the detector of the invention, a sensor for detecting a current or voltage used can be precisely and securely positioned in a sealed case, thereby realizing a structure resistant to vibration and a highly hermetic seal of the detector. Further, the detector of the invention can be easily attached at any position along a distribution line, even when the line is hot. According to the invention, a detector which is very useful in a monitoring system for a distribution line.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

We claim:

1. A current detector for a distribution system, comprising a lower section, an upper section, and a fastening means for combining said lower and upper sections into one body, said lower section comprising: a first receiving portion for receiving an electric wire of the distribution system, said first receiving portion being disposed on the upper surface of said lower section; and an optical type current sensor, said upper section comprising a second receiving portion for receiving the electric wire, said second receiving portion being disposed on the lower surface of said upper section to face said first receiving portion, said upper section further including a U-shaped magnetic core surrounding said second receiving portion, the two end portions of said magnetic core protruding from the surface of said upper section, said lower section further comprising two recesses for receiving the two end portions of said U-shaped core when said upper and lower sections are combined into one body, and wherein said current sensor means is disposed within the gap of said U-shaped magnetic core when said upper and lower sections are combined into one body.

2. A detector according to claim 1, wherein the position of said current sensor is adjustable.

3. A detector according to claim 1, wherein said current sensor has a magnetic optical sensor element which detects, using the Faraday effect, the strength of a magnetic field generated by the current flowing through the electric wire received in said first and second receiving portions.

4. A detector according to claim 1, wherein an output signal of said current sensor is transmitted outside through an optical fiber.

5. A current and voltage detector for a distribution system, comprising a lower section, an upper section and a fastening means for combining said lower and upper sections into one body, said lower section comprising: a first receiving portion for receiving an electric wire of the distribution system, said first receiving portion being disposed on the upper surface of said lower section; an optical type current sensor; and an optical type voltage sensor, said upper section comprising a second receiving portion for receiving the electric wire, said second receiving portion being disposed on the lower surface of said upper section to face said first receiving portion, said upper section further including a U-shaped magnetic core surrounding said second receiving portion, the two end portions of said magnetic core protruding from the surface of said upper section, said lower section further comprising two recesses for receiving the two protruding end portions of said U-shaped core when said upper and lower sections are combined into one body, and wherein said current sensor is disposed within the gap of said U-shaped magnetic core when said upper and lower sections are combined into one body.

6. A detector according to claim 5, wherein the position of said current sensor is adjustable.

7. A detector according to claim 5, wherein said current sensor has a magnetic optical sensor element which detects, using the Faraday effect, the strength of a magnetic field generated by the current flowing through the electric wire received in said first and second receiving portions.

8. A detector according to claim 5, wherein said lower section further comprises a capacitive type potential divider disposed in the vicinity of said first receiving portion, the output voltage of said potential divider being applied to said voltage sensor.

9. A detector according to claim 5, wherein said upper section further comprises a further capacitive type potential divider disposed in the vicinity of said second receiving portion, said further potential divider and said potential divider of said lower section being electrically connected through a connecting means.

10. A detector according to claim 5, wherein said voltage sensor has a sensor element which utilizes the Pockels effect.

11. A detector according to claim 5, wherein at least either of the electrode area and electrode distance of said potential divider is adjustable.

12. A detector according to claim 5, wherein output signals of said current and voltage sensors are transmitted outside through optical fibers.

13. A detector according to claim 1, wherein said first and second receiving portions are for engaging the electric wire.

14. A detector according to claim 5, wherein said first and second receiving portions are for engaging the electric wire.

* * * * *